United States Patent
Tripathi et al.

(10) Patent No.: US 6,569,751 B1
(45) Date of Patent: May 27, 2003

(54) LOW VIA RESISTANCE SYSTEM

(75) Inventors: Prabhakar P. Tripathi, Santa Clara, CA (US); Zhihai Wang, Sunnyvale, CA (US); Weidan Li, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 142 days.

(21) Appl. No.: 09/617,550

(22) Filed: Jul. 17, 2000

(51) Int. Cl.[7] .................. H01L 21/28; H01L 21/44; H01L 21/4763
(52) U.S. Cl. .............. 438/572; 438/653; 438/627; 438/648; 438/685; 438/614; 438/618
(58) Field of Search ................ 438/572, 653, 438/627, 629, 648, 618, 584, 614, 622, 685

(56) References Cited

U.S. PATENT DOCUMENTS

| | | | | |
|---|---|---|---|---|
| 5,780,356 A | * | 7/1998 | Kim ........................ 438/627 |
| 6,054,382 A | * | 4/2000 | Hsu et al. ................. 438/628 |
| 6,080,285 A | * | 6/2000 | Liu et al. ................. 204/192.12 |
| 6,100,182 A | * | 8/2000 | Lee et al. ................. 438/637 |
| 6,103,618 A | * | 8/2000 | Abe ........................ 438/637 |
| 6,140,223 A | * | 10/2000 | Kim et al. ................ 438/629 |
| 6,150,720 A | * | 11/2000 | Yamaha et al. ............ 257/751 |
| 6,156,647 A | * | 12/2000 | Hogan .................... 438/653 |
| 6,251,735 B1 | * | 6/2001 | Lou ........................ 438/296 |
| 6,271,592 B1 | * | 8/2001 | Kim et al. ................. 257/751 |
| 6,291,342 B2 | * | 9/2001 | Lee et al. ................. 438/648 |
| 6,303,490 B1 | * | 10/2001 | Jeng ....................... 438/627 |
| 6,319,826 B1 | * | 11/2001 | Chen et al. ............... 438/653 |
| 6,348,731 B1 | * | 2/2002 | Ashley et al. ............ 257/751 |
| 6,383,929 B1 | * | 5/2002 | Boettcher et al. ......... 438/687 |
| 6,391,769 B1 | * | 5/2002 | Lee et al. ................. 438/643 |
| 6,420,260 B1 | * | 7/2002 | Ngan et al. ............... 438/627 |
| 6,432,819 B1 | * | 8/2002 | Pavate et al. ............. 438/676 |

FOREIGN PATENT DOCUMENTS

| | | | |
|---|---|---|---|
| GB | 2298657 A | * | 9/1996 |
| JP | 02001044201 A | * | 2/2001 |

* cited by examiner

*Primary Examiner*—Matthew Smith
*Assistant Examiner*—Chuong A. Luu
(74) *Attorney, Agent, or Firm*—Luedeka, Neely & Graham, PC

(57) ABSTRACT

A method of forming a metallization interconnection system within a via. A first liner layer of titanium is deposited to a first thickness in the following manner. A substrate containing the via is placed within an ion metal plasma deposition chamber that contains a titanium target. The ion metal plasma deposition chamber is evacuated to a first base pressure. A first flow of argon is introduced to the ion metal plasma deposition chamber at a first deposition pressure. The substrate is biased to a first voltage. A plasma within the ion metal plasma deposition chamber is energized at a first power for a first length of time. A second liner layer of $Ti_xN_y$ is deposited to a second thickness on top of the first liner layer of titanium in the following manner. A first flow of nitrogen and a second flow of argon are introduced to the ion metal plasma deposition chamber at a second deposition pressure. The substrate is biased to a second voltage. The plasma within the ion metal plasma deposition chamber is energized at a second power for a second length of time, after which the substrate is removed from the ion metal plasma deposition chamber. Finally, a third liner layer of titanium nitride is deposited in a second deposition chamber, and a plug of tungsten is deposited.

17 Claims, 1 Drawing Sheet

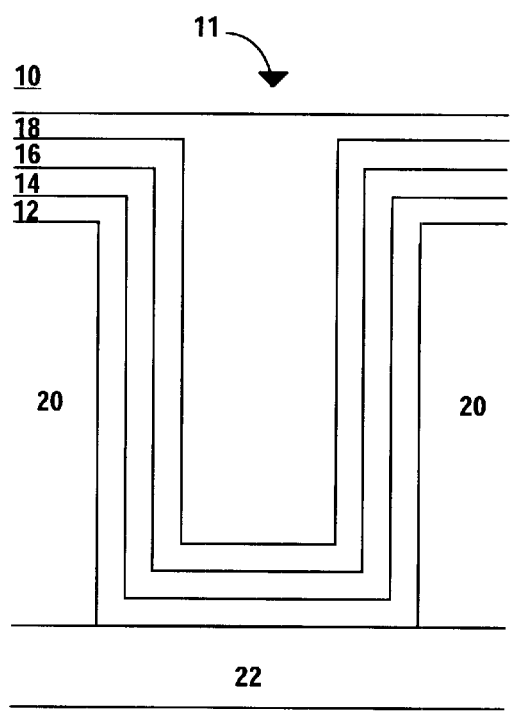

LOW VIA RESISTANCE SYSTEM

FIELD

This invention relates to the field of integrated circuit processing. More particularly the invention relates to a system for reducing contact resistance between metallic interconnection layers in a via structure.

BACKGROUND

Vias are structures that are formed to enable electrical contact between different electrical interconnection layers in an integrated circuit. The via is typically formed in an insulating layer that is disposed between the two electrical interconnection layers, so that electrical contact only occurs at predetermined locations between the two electrical interconnection layers. The via is typically an etched hole that has a relatively high aspect ratio, meaning that it tends to be much deeper than it is wide. This is especially true as device geometries continually shrink.

Typically, a via is filled with a metallic electrical conduction system that makes contact between the underlying conduction layer disposed below the insulating layer in which the via is formed and the overlying conduction layer disposed above the insulating layer in which the via is formed. In a typical process, several different layers of metallic materials are used to fill the via. A thin titanium liner layer is first deposited as an adhesion layer and as a gettering layer. A thin titanium nitride liner layer is then deposited as a barrier layer to protect the underlying layers during subsequent processing. Finally, a tungsten plug is deposited to completely fill the via.

Because the via is a relatively small structure, it is important to reduce any electrical resistance created within the via by as great a degree as possible. One source of electrical resistance within the via is contact resistance between the metallic layers of the system as described above, such as can be caused by oxidation of the surfaces of the various layers. Oxidation of a layer tends to occur whenever the layer is exposed to the atmosphere, such as when it is transported from the chamber in which an underlying layer is deposited to the chamber in which an overlying layer is deposited. Oxidation is a particular problem with the titanium liner layer, which oxidizes very quickly in the presence of oxygen.

What is needed, therefore, is a system for reducing the contact resistance in a via by reducing the oxides that form on the titanium liner layer.

SUMMARY

The above and other needs are met by a method of forming a metallization interconnection system within a via. A first liner layer of titanium is deposited to a first thickness in the following manner. A substrate containing the via is placed within an ion metal plasma deposition chamber that contains a titanium target. The ion metal plasma deposition chamber is evacuated to a first base pressure. A first flow of argon is introduced to the ion metal plasma deposition chamber at a first deposition pressure. The substrate is biased to a first voltage. A plasma within the ion metal plasma deposition chamber is energized at a first power for a first length of time.

A second liner layer of $Ti_xN_y$ is deposited to a second thickness on top of the first liner layer of titanium in the following manner. A first flow of nitrogen and a second flow of argon are introduced to the ion metal plasma deposition chamber at a second deposition pressure. The substrate is biased to a second voltage. The plasma within the ion metal plasma deposition chamber is energized at a second power for a second length of time, after which the substrate is removed from the ion metal plasma deposition chamber. Finally, a third liner layer of titanium nitride is deposited in a second deposition chamber, and a plug of tungsten is deposited.

Because the second liner layer of $Ti_xN_y$ is deposited in the same chamber as the first liner layer of titanium, there is no opportunity for the first liner layer of titanium to oxidize to titanium oxide, which prevents the problems as described above. Further, because the $Ti_xN_y$ is deposited using ion metal plasma deposition, there is no cusping at the top of the via structure, which further prevents the problems as described herein.

BRIEF DESCRIPTION OF THE DRAWINGS

Further advantages of the invention are apparent by reference to the detailed description when considered in conjunction with the FIGURE, which is not to scale so as to more clearly show the details, and which depicts a partial cross-sectional view of a via filled with a metallization interconnection system according to the present invention

DETAILED DESCRIPTION

Referring now to the FIGURE, there is depicted a metallization interconnection system 10, constructed according to a preferred embodiment of the present invention. The metallization interconnection system 10 is deposited within a via 11 that is defined between sidewalls 20, such as would be formed in a dielectric layer. The metallization interconnection system 10 makes ohmic contact between a lower conduction layer 22 and an upper conduction layer that is not depicted.

The first layer in the metallization system 10 is a first liner layer of titanium 12. The first liner layer of titanium 12 functions as a gettering layer to clean out impurities that may be present in the via 11. The first liner layer of titanium 12 is preferably deposited using an ion metal plasma deposition method.

During ion metal plasma deposition, atoms of the metal to be deposited are sputtered from a target and ionized in a plasma with a density of between about $10^{10}$ ions/cm$^3$ and about $10^{13}$ ions/cm$^3$, and most preferably about $10^{12}$ ions/cm$^3$. The metal ions are then drawn in a highly directional manner toward the substrate by an electrical bias on the substrate, and are uniformly deposited across the surfaces of the substrate, as mentioned above. Ion metal plasma deposition, such as described herein, can be performed in a deposition chamber such as the Vectra chamber that is integrated on the Endura cluster tool platform, as manufactured by Applied Materials, Inc. of Santa Clara, Calif.

Ion metal plasma deposition is a physical vapor deposition technique that produces a film that is visually distinguishable from those deposited by other physical vapor deposition techniques, in that it produces a film that has better coverage at the bottom of the via and less top side wall coverage. In other words, films deposited using ion metal plasma deposition have good step coverage in comparison to films produced by other physical vapor deposition techniques. For example, other forms of physical vapor deposition, such as sputtering, tend to produce films that cusp at the top edges of the via 11. This cusping of the deposited film tends to get increasingly worse as additional films are deposited, and often results in an inability to completely fill the via 11. This situation creates several problems with the integrated circuit, and is preferably avoided.

Thus, the first liner layer of titanium 12 as depicted in the FIGURE has very good step coverage. As mentioned above, the cross-sectional profile of the ion metal plasma deposited first liner layer of titanium 12 is immediately distinguishable from other physical vapor deposition techniques, which produced a cusped film.

To deposit the first liner layer of titanium 12, the substrate on which the via 11 is disposed is brought into an ion metal plasma deposition chamber containing a titanium target, and the ion metal plasma deposition chamber is evacuated to a first base pressure. The first base pressure is preferably between about $10^{-9}$ Torr and about $10^{-6}$ Torr, and most preferably about $5\times10^{-9}$ Torr. A first flow of argon is then introduced to the ion metal plasma deposition chamber. The first flow of argon is preferably between about 0.5 sccm and about 200 sccm, and most preferably about 20 sccm. The valving leading to the vacuum pumps on the ion metal plasma deposition chamber is adjusted to produce a first pressure inside of the ion metal plasma deposition chamber of between about $10^{-4}$ Torr and about 0.1 Torr, and most preferably about $30\times10^{-3}$ Torr.

The substrate is biased to a first voltage of between about 0 volts and about −500 volts, and most preferably about −150 volts, and a plasma is ignited within the ion metal plasma deposition chamber at a first power of between about 1 kilowatts and about 50 kilowatts, and most preferably about 5 kilowatts. A direct current power supply is used to provide the power to ignite the plasma in the preferred embodiment. However, in other embodiments a radio frequency power supply may be used. In a most preferred embodiment the substrate is held at a first temperature of between about −50 centigrade and about 400 centigrade, and most preferably about 200 centigrade, during the ion metal plasma deposition of the first liner layer of titanium 12.

The deposition of the first liner layer of titanium 12 proceeds for a first length of time, which is preferably a period of time of between about 1 seconds and about 100 seconds, and most preferably about 20 seconds. Ion metal plasma deposition for this length of time under the conditions specified above produces a first liner layer of titanium 12 with a thickness of between about 5 angstroms and about 1,000 angstroms, and most preferably about 150 angstroms.

After the deposition of the first liner layer of titanium 12, a second liner layer of $Ti_xN_y$ is deposited. As described above, if the first liner layer of titanium 12 is exposed to oxygen, such as by bringing the substrate out of the ion metal plasma deposition chamber and into the atmosphere, then the first liner layer of titanium 12 oxidizes at the surface and forms a layer of titanium oxide. The layer of titanium oxide increases the resistance within the metallization interconnection layer 10, and creates problems with the integrated circuit of which it is a part. Thus, it is preferred to cap the first liner layer of titanium 12 in some manner, prior to exposing the substrate to the atmosphere.

In the preferred embodiment of a method according to the present invention, this is accomplished by depositing a second liner layer of $Ti_xN_y$ 14 on top of the first liner layer of titanium 12. The second liner layer of $Ti_xN_y$ 14 is preferably deposited in the same ion metal plasma deposition chamber as that which is used to deposit the first liner layer of titanium 12. In this manner, there is no opportunity for the first liner layer of titanium 12 to be exposed to oxygen and form a titanium oxide layer. In an alternate embodiment, the second liner layer of $Ti_xN_y$ 14 is deposited within a separate ion metal plasma deposition chamber within the same cluster tool in which the ion metal plasma deposition chamber for the first liner layer of titanium 12 resides. In this manner, the substrate is again not exposed to the atmosphere between depositions of the first liner layer of titanium 12 and the second liner layer of $Ti_xN_y$ 14.

It is noted that the second liner layer of $Ti_xN_y$ 14 is deposited using only ion metal plasma deposition, and not any other form of physical vapor deposition or any form of chemical vapor deposition. Some of the purposes for this selection of deposition technique are to reduce the degree of cusping that is inherent with other forms of physical vapor deposition, as described elsewhere in this discussion, and further to reduce the oxidation of the first liner layer of titanium 14 that are attendant with exposing the first liner layer of titanium 14 to the atmosphere, and may be attendant with various forms of chemical vapor deposition, even if the first liner layer of titanium 14 is not exposed to the atmosphere prior to such deposition.

To deposit the second liner layer of $Ti_xN_y$ 14, a first flow of nitrogen is introduced to the ion metal plasma deposition chamber. The first flow of nitrogen is preferably between about 1 sccm and about 200 sccm, and most preferably about 100 sccm. The first flow of argon is preferably adjust to a second flow of argon at a flow rate of between about 0.5 sccm and about 100 sccm, and most preferably about 20 sccm. In a most preferred embodiment, the flow rate of the first flow of argon is gradually changed to the flow rate of the second flow of argon, rather than halting the first flow of argon and then commencing the second flow of argon. The valving leading to the vacuum pumps on the ion metal plasma deposition chamber is adjusted to produce a second pressure inside of the ion metal plasma deposition chamber of between about 104 Torr and about 0.1 Torr, and most preferably about $30\times10^{-3}$ Torr.

The substrate is biased to a second voltage of between about 0 volts and about 400 volts, and most preferably about −−150 volts. In a most preferred embodiment, the first voltage is gradually changed to the second voltage, rather than halting the first voltage and then applying the second voltage. A plasma is ignited within the ion metal plasma deposition chamber at a second power of between about 1 kilowatts and about 50 kilowatts, and most preferably about 2 kilowatts. In a most preferred embodiment, the first power applied to the plasma is gradually adjusted to the second power applied to the plasma; rather than shutting off the first power and then re-igniting the plasma with the application of the second power.

As before, a direct current power supply is used to power the plasma in the preferred embodiment. However, in other embodiments a radio frequency power supply may be used. In a most preferred embodiment the substrate is held at a second temperature of between about −50 centigrade and about 400 centigrade, and most preferably about 200 centrigrade, during the ion metal plasma deposition of the second liner layer of $Ti_xN_y$ 14.

The deposition of the second liner layer of $Ti_xN_y$ 14 proceeds for a second length of time, which is preferably a period of time of between about 0.1 seconds and about 100 seconds, and most preferably about 5 seconds. Ion metal plasma deposition for this length of time under the conditions specified above produces a second liner layer of $Ti_xN_y$ 14 with a thickness of between about 1 angstroms and about 300 angstroms, and most preferably about 20 angstroms. At the end of this deposition, the plasma is preferably extinguished, and the substrate is removed from the ion metal plasma deposition chamber.

Because of the introduction of the first flow of nitrogen into the ion metal plasma deposition chamber, the second liner layer of $Ti_xN_y$ 14 can be formed in the same chamber in which the first liner layer of titanium 12 is formed. The second liner layer of $Ti_xN_y$ 14 acts as a capping layer to the first liner layer of titanium 12, because the second liner layer of $Ti_xN_y$ 14 does not oxidize as readily when exposed to oxygen. Therefore, the substrate may be safely removed from the ion metal plasma deposition chamber at this point without fear of oxidizing the first liner layer of titanium 12 and creating the problems as described above.

Because the second liner layer of $Ti_xN_y$ 14 is deposited using the ion metal plasma deposition process as described above, it is visually distinguishable from $Ti_xN_y$ layers that are deposited with other physical vapor deposition techniques, such as sputtering. This is because the other physical vapor deposition techniques tend to produce cusping of the deposited layer at the top of the via 11, as described above, whereas the ion metal plasma deposition produces a layer that has good step coverage. The second liner layer of $Ti_xN_y$ 14, as deposited using ion metal plasma deposition, is also visually distinguishable from layers that are deposited using chemical vapor deposition. Thus, a layer deposited with ion metal plasma deposition is physically distinguishable from a layer that is deposited using another deposition method. The metallization interconnection system 10 as described above is further physically distinguishable from other metallization systems in that there is no titanium oxide layer on top of the first liner layer of titanium 12.

The second liner layer of $Ti_xN_y$ 14 is purposely recited herein without a specific stoichiometry, because the processing conditions described above do not necessarily produce a film that has a single, set stoichiometry. As described elsewhere, the purpose of the second liner layer of $Ti_xN_y$ 14 is not to have a specific stoichiometry, but rather to provide a capping layer to the first liner layer of titanium 12, so that it does not oxidize, and to do so in a manner that will not produce cusping and the problems attendant with cusping. This can be accomplished with a wide range of stoichiometries of the second liner layer of $Ti_xN_y$ 14. However, in a preferred embodiment of the invention, the value for X is between about 0.45 and about 0.8, and most preferably about 0.5, while the value for Y is between about 0.55 and about 0.2, and most preferably about 0.5.

To complete the metallization interconnection system 10, a third liner layer of titanium nitride (TiN) 16 is deposited with a stoichiometry that is more definitely set as compared to the second liner layer of $Ti_xN_y$ 14, and which is deposited such as by using a chemical vapor deposition method. The stoichiometry of the third liner layer of titanium nitride 16 is preferably more definitely set because the third liner layer of titanium nitride 16 is intended to function as a barrier layer during later processing, and thus the third liner layer of titanium nitride 16 requires certain physical properties, such as chemical resistance, that are attendant with its set stoichiometry. Finally, the via 11 is filled with a tungsten plug 18, such as may be formed with a chemical vapor deposition. The metallization interconnection system 10 is then preferably planarized and the processing of the substrate continues.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming a metal interconnection system within a via, comprising the sequential steps of:

depositing a first liner layer of titanium using ion metal plasma deposition in an ion metal plasma deposition chamber, depositing a second liner layer of $Ti_xN_y$ using ion metal plasma deposition in the ion metal plasma deposition chamber, where X is between about 0.45 and about 0.8, and Y is between about 0.55 and about 0.2, depositing a third liner layer of titanium nitride using chemical vapor deposition in a second deposition chamber, and depositing a plug of tungsten.

2. The method of claim 1, wherein the first liner layer of ion metal plasma deposited titanium is deposited to a thickness of between about 5 angstroms and about 1000 angstroms.

3. The method of claim 1, wherein the second liner layer of ion metal plasma deposited $Ti_xN_y$ is deposited to a thickness of between about 1 angstroms and about 300 angstroms.

4. A method of forming a metallization interconnection system within a via, comprising the steps of:

depositing a first liner layer of titanium to a first thickness by;
  placing a substrate containing the via within an ion metal plasma deposition chamber that contains a titanium target,
  evacuating the ion metal plasma deposition chamber to a first base pressure,
  introducing to the ion metal plasma deposition chamber a first flow of argon at a first deposition pressure,
  biasing the substrate to a first voltage, and
  energizing a plasma within the ion metal plasma deposition chamber at a first power for a first length of time, depositing a second liner layer of $Ti_xN_y$ to a second thickness, where X is between about 0.45 and about 0.8, and Y is between about 0.55 and about 0.2, by:
  introducing to the ion metal plasma deposition chamber a first flow of nitrogen and a second flow of argon at a second deposition pressure,
  biasing the substrate to a second voltage,
  energizing the plasma within the ion metal plasma deposition chamber at a second power for a second length of time, and
  removing the substrate from the ion metal plasma deposition chamber, depositing a third liner layer of titanium nitride in a second deposition chamber, and depositing a plug of tungsten.

5. The method of claim 4, wherein the first flow of argon further comprises a flow of between about 0.5 sccm and about 200 sccm.

6. The method of claim 4, wherein the first deposition pressure further comprises a pressure of between about $10^{-4}$ Torr and about 0.1 Torr.

7. The method of claim 4, wherein the first voltage further comprises a voltage of between about 0 volts and about −400 volts.

8. The method of claim 4, wherein the first power further comprises a power of between about 1 kilowatts and about 50 kilowatts.

9. The method of claim 4, wherein the first length of time further comprises a length of time of between about 1 seconds and about 100 seconds.

10. The method of claim 4, wherein the first flow of nitrogen further comprises a flow of between about 1 sccm and about 200 sccm.

11. The method of claim 4, wherein the second flow of argon further comprises a flow of between about 0.5 sccm and about 100 sccm.

12. The method of claim 4, wherein the second deposition pressure further comprises a pressure of between about $10^{-4}$ Torr and about 0.1 Torr.

13. The method of claim 4, wherein the second voltage further comprises a voltage of between about 0 volts and about −400 volts.

14. The method of claim 4, wherein the second power further comprises a power of between about 1 kilowatts and about 50 kilowatts.

15. The method of claim 4, wherein the second length of time further comprises a length of time of between about 0.1 seconds and about 100 seconds.

16. The method of claim 4, wherein the first thickness further comprises a thickness of between about 5 angstroms and about 1000 angstroms.

17. The method of claim 4, wherein the second thickness further comprises a thickness of between about 1 angstroms and about 300 angstroms.

* * * * *